(12) United States Patent
Ling

(45) Date of Patent: US 8,399,267 B2
Mar. 19, 2013

(54) METHODS FOR PACKAGING LIGHT EMITTING DEVICES AND RELATED MICROELECTRONIC DEVICES

(75) Inventor: Peiching Ling, Santa Clara, CA (US)

(73) Assignee: Achrolux Inc, Santa Clara, CA (US)

( * ) Notice: Subject to any disclaimer, the term of this patent is extended or adjusted under 35 U.S.C. 154(b) by 50 days.

(21) Appl. No.: 12/977,248

(22) Filed: Dec. 23, 2010

(65) Prior Publication Data
US 2011/0156072 A1 Jun. 30, 2011

Related U.S. Application Data

(60) Provisional application No. 61/284,814, filed on Dec. 26, 2009.

(51) Int. Cl.
*H01L 21/00* (2006.01)
(52) U.S. Cl. .................. 438/22; 438/28; 438/34
(58) Field of Classification Search .......... 438/14–47, 438/E21.521, E33.072–E33.073
See application file for complete search history.

(56) References Cited

U.S. PATENT DOCUMENTS

| 2011/0316032 A1* | 12/2011 | Ooyabu et al. ............... 257/98 |
| 2012/0086024 A1* | 4/2012 | Andrews et al. ............. 438/26 |
| 2012/0187371 A1* | 7/2012 | Raring et al. ................ 257/13 |

* cited by examiner

*Primary Examiner* — Cuong Q Nguyen
(74) *Attorney, Agent, or Firm* — Turocy & Watson, LLP

(57) ABSTRACT

A method for forming a light emitting device includes providing a light emitting diode (LED) configured to emit light of a first color and providing a plurality of semi-spherical lenses made of a silicone material that contains no phosphor material. Each of the lenses has a layer of phosphor material attached thereto. The method also includes testing the plurality of lenses to select a subset of lenses that converts light of the first color to light of a second color. The method further includes forming the light emitting device using the LED, one of the selected subset of lenses, and a heat conductive substrate. In an embodiment, after the testing of the plurality of lenses, one of the selected subset of lenses is disposed overlying the LED. In another embodiment, the testing of the plurality of lenses is conducted with a light source other than the LED.

23 Claims, 5 Drawing Sheets

METHODS FOR PACKAGING LIGHT EMITTING DEVICES AND RELATED MICROELECTRONIC DEVICES

BACKGROUND OF THE INVENTION

1. Field of the Invention

This invention relates to light emitting diodes, and, more particularly, to methods for packaging light emitting devices and related microelectronic devices.

2. Description of Related Art

Introduced as an electronic element in 1962, a light emitting diode (LED) may be used as indicator lamps in many devices, and used for lighting. Modern LEDs emit visible, ultraviolet and infrared wavelengths, with very high brightness.

LEDs are getting to replace automotive lighting (particularly brake lamps and turn signals) as well as traffic signals. With the advantages of compact size, narrow bandwidth, high switching speed, and improved reliability, LEDs are becoming more and more popular in the art.

SUMMARY OF THE INVENTION

Embodiments of this invention relate to semiconductor light emitting devices (LED) as well as associated passive and active devices that are integrated part of a complete LED system, and fabricating methods therefore. More particularly, some embodiments of the present invention provide packaging and packaging methodologies for semiconductor light emitting devices. Certain embodiments of the present invention describe methods of packaging LED, wherein LED chips are placed on metal heat sink for thermal dissipation, alternate material and method for its attachment, where phosphor encapsulation structure is mounted in the assembly for light conversion. Further, in some embodiments, an optical component which is typically used as secondary optics for LED lighting module may be integrated into the package according to some of embodiments of the present invention. This LED package platform has high-efficiency thermal dissipation, and substantially reduces cost in packaging as well by eliminating several packaging steps as conducted in traditional methods.

In an embodiment, a method for forming a light emitting device includes providing a light emitting diode (LED) configured to emit light of a first color and providing a plurality of semi-spherical lenses made of a silicone material that contains no phosphor material. Each of the lenses has a layer of phosphor material attached thereto. The method also includes testing the plurality of lenses to select a subset of lenses that converts light of the first color to light of a second color. The method further includes forming the light emitting device using said LED, one of the selected subset of lenses, and a heat conductive substrate. In an embodiment, the lenses may be selected according to a specific wavelength range of the second color. In an embodiment, after the testing of the plurality of lenses, one of the selected subset of lenses is disposed overlying said LED. In another embodiment, the testing of the plurality of lenses is conducted with a light source other than said LED.

In another embodiment, a light emitting device includes a heat conductive substrate, at least one semiconductor light emitting diode (LED), and an encapsulant overlying the at least one LED. The encapsulant includes a substantially uniform layer of wavelength-converting material. Moreover, the encapsulant is preformed and pre-characterized for optical properties prior to being disposed overlying the LED. In an embodiment, the encapsulant may be tested according to a specification for converting light of the first color to light of a second color. In an embodiment, the encapsulant may be selected according to a specific wavelength range of the second color. In another embodiment, the substantially uniform layer of wavelength-converting material is preformed into the encapsulant, e.g. a lens.

These and other features and advantages of embodiments of the present invention will be more fully understood and appreciated upon consideration of the detailed description of the preferred implementations of the embodiments, in conjunction with the following drawings.

DETAILED DESCRIPTION OF PREFERRED EMBODIMENTS

Figure 1A:
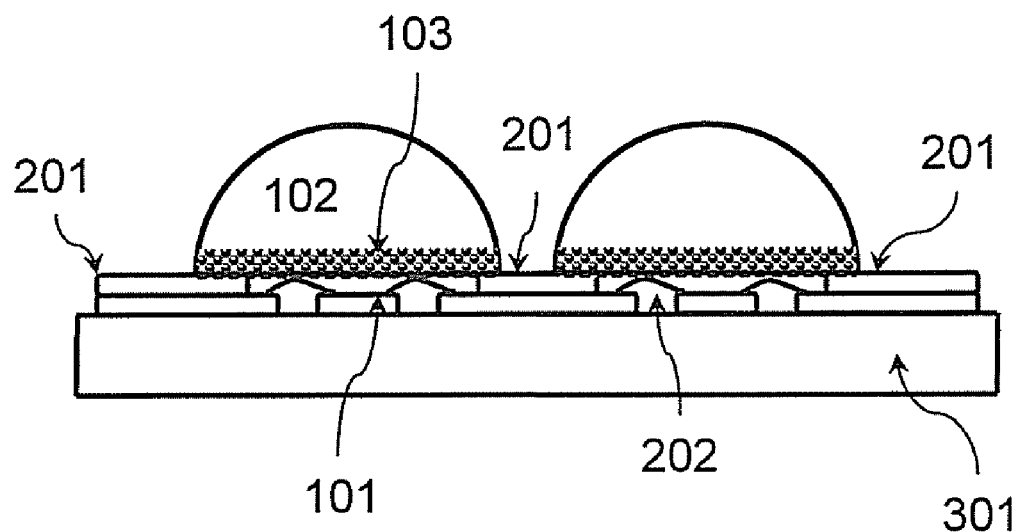
FIGS. 1A and 1B are simplified cross-sectional views of LED packages wherein LEDs are placed on a metal heat sink, and phosphor encapsulation structure is mounted for light conversion.

Embodiments of the present invention describe a new LED package platform to address issues of thermal dissipation, and provide significant cost reduction for semiconductor light emitting devices. As used herein, the term semiconductor light emitting device may include a light emitting diode, laser diode, or/and other semiconductor device which may include one or more semiconductor layers, and which may include silicone, sapphire, silicon carbide, or/and other semiconductor material. In the description below, an LED is used as an example to illustrate details of packaging methods.

In current LED packaging methods, LED chip is assembled into a carrier (level-1) such as ceramic, silicone or plastic. The level-1 package is usually necessary for phosphor process for color conversion, and color binning of the white color points. Next, a set of level-1 LED products are integrated on PCB (level-2), and then mounted on a heat sink such as copper, aluminum or other thermal conductive materials for thermal dissipation of the light engine.

In such packaging methods as the above described, there exists several thermal barriers (interfaces like chip-carrier, carrier-PCB, and PCB-heat sink) to dissipate the heat from LED chip to heat sink in the design of LED light engine. Although several different package concepts were proposed to resolve the thermal issues, these methods usually add cost to package. One of solutions is so-called Chip-on-board (COB), wherein LED chip is directly mounted on circuit board to reduce thermal barriers and packaging cost.

Although COB technique simplifies assembly process, skipping level-1 process, however, it is known that poor thermal conductivity of PCB material limits LED application in high power regime. In addition, dispensing phosphor-silicone mixture used for white light conversion in COB package has difficulties in achieving good color quality such as color consistency, color uniformity over angle, color rendering index, and so on—where product optimization through color binning of the white color points is not possible.

Features of new package platforms provided in embodiments of the present invention described below, which can be applied to LED lamp package or/and light engine structure, include the following:

- LED chip is mounted on metal heat sink to maximize capacity of heat dissipation
- Different mounting technique, where conventional conductive attachment is accompanied by heat pipe—therefore increasing the thermal dissipation and reducing total thermal resistance by an order of magnitude.
- Eliminating traditional level-1 and level-2 packaging gives cost advantage.
- Integrate secondary optics with heat sink structure. The surface of optics may have highly reflective coating material.
- Pre-characterized phosphor encapsulations such as phosphor lens or phosphor sheet can be attached on the packaging to significantly improve color quality such as color consistency, color uniformity, color rendering, and so on, for the packaging structure.
- The phosphor encapsulation such as lens may be attached individually to the package or attached in an array to the light engine.
- Attachment procedure to overlay phosphor layer over individually or arrayed wire bonded LEDs to make the light engine.

In some embodiments, an LED chip is directly mounted on a heat sink, which can be made of a material having suitable heat conductivity, for example, a metal or other conductors. In other embodiments, an insulating layer having suitable heat conductivity can be placed between the LED die and the heat sink. Such an insulating layer can allow more flexible wiring connections. In some embodiments, electrical circuit connections can be formed on a circuit board attached on the heat sink. In an example, the circuit board can be placed adjacent to the LED chip. In another example, the LED chip can be placed in an opening of a circuit board.

In some embodiments, the LED chip is directly mounted on a heat sink and integrated with a phosphor encapsulation structure. In an embodiment, the phosphor encapsulation structure can be a lens with a phosphor-containing light conversion layer built in. In some embodiments, the phosphor encapsulation structures can be pre-characterized and pre-sorted. Some examples of the phosphor encapsulation structures are described in our previous patent applications. For example, U.S. Patent Application No. 61/216,374 on May 15, 2009 and U.S. Patent Application No. 61/273,129 on Jul. 30, 2009.

Some alternative embodiments provide a lighting apparatus that includes an LED die configured to emit light within a first wavelength range and a phosphor encapsulation structure overlying the LED die. In an embodiment, the phosphor encapsulation structure is configured to transmit light of target color when receiving input light within the first wavelength range of LED die. The phosphor encapsulation structure contains phosphor material which is pre-measured for color point to match specific wavelength of LED for desired white color point.

In some embodiments, the LED chips can be pre-tested and pre-binned, and the phosphor encapsulation structure can also be pre-binned. Then matching LED chips and phosphor encapsulation structure can be selected to form a lighting device for emitting certain target light color.

In some embodiments, the LED die may have two metal contacts on the same side of the die or opposite sides of the LED die. For LED with metal contacts on opposite sides, an insulating layer is necessary to connect the LED's in series applications.

In some embodiments, a flat bottom phosphor encapsulation is used. The loop of wire bond is lower than the height of circuit board for not damaging wire during attachment. In an embodiment, the flat bottom phosphor encapsulation can be mounted on the edge of a circuit board.

Embodiments of the present invention will be now described below with reference to various examples illustrated in the figures.

FIG. 1A illustrates a light lamp or light engine structure, in where in LED 101 is placed on the top of a metal heat sink 301 with an epoxy or solder material. Because LEDs are directly placed on a metal heat sink, this structure gives best-achievable thermal conductivity for LED lamp or LED light engine. The heat sink may be one of any materials commonly adapted in LED packaging such as copper, aluminum, ceramic, and so on. A layer of printed circuit board (PCB) 201 is laminated on the top of heat sink as an insulating layer for electrical connection. The thickness of PCB material is higher than the loop of wire bond, so that phosphor encapsulation can be placed on the top without damaging the bonded wire 202. The space between LED chip and encapsulation is filled up with a pre-determined amount of silicone gel. Alternatively, the space may be filled in with silicone material prior to phosphor encapsulation or lens attachment.

Figure 3:
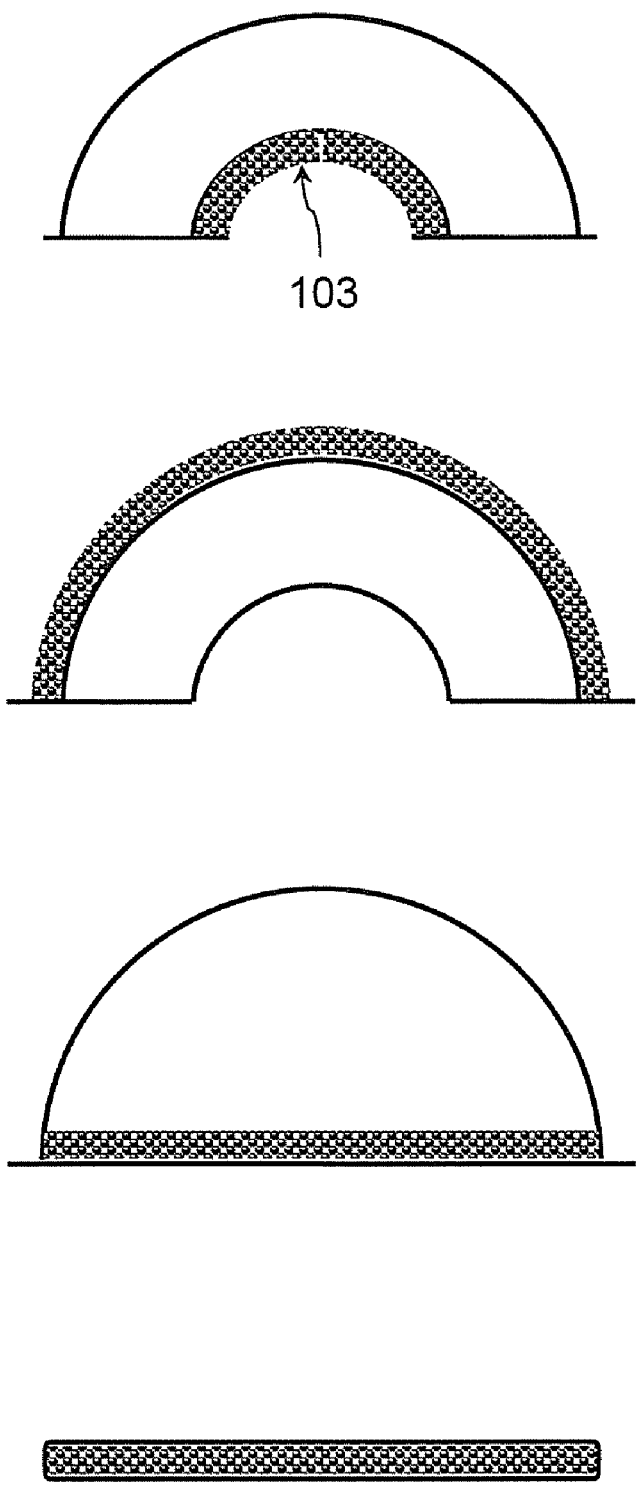
FIG. 3 illustrates simplified cross-sectional views of different types of LED phosphor encapsulation structures that may be attached on an LED package according to embodiments of the present invention.

The phosphor encapsulation structure 102 containing phosphor particles 103 may be a lens or a phosphor sheet as shown in FIG. 3. The color properties such as correlated color temperature (CCT) or color points of phosphor encapsulation is pre-measured and selected to match LED for desired color properties of LED lamps and light engines.

Figure 1B:
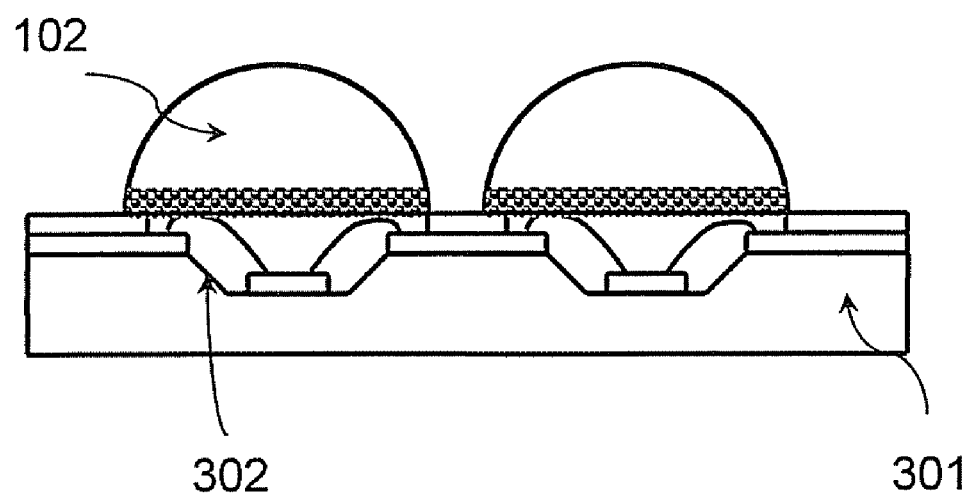

FIG. 1B illustrated a light lamp or light engine structure with an inclusion of recess in heat sink 301. The recess in the heat sink includes a surface 302 which may serve as a light reflector to increase amount of blue photons for white light conversion in phosphor encapsulation structure 102. The reflector surface 302 may contain a highly reflective coating material for example but not limited to such as TiOx coating or whitish PCB material.

Figure 2A:
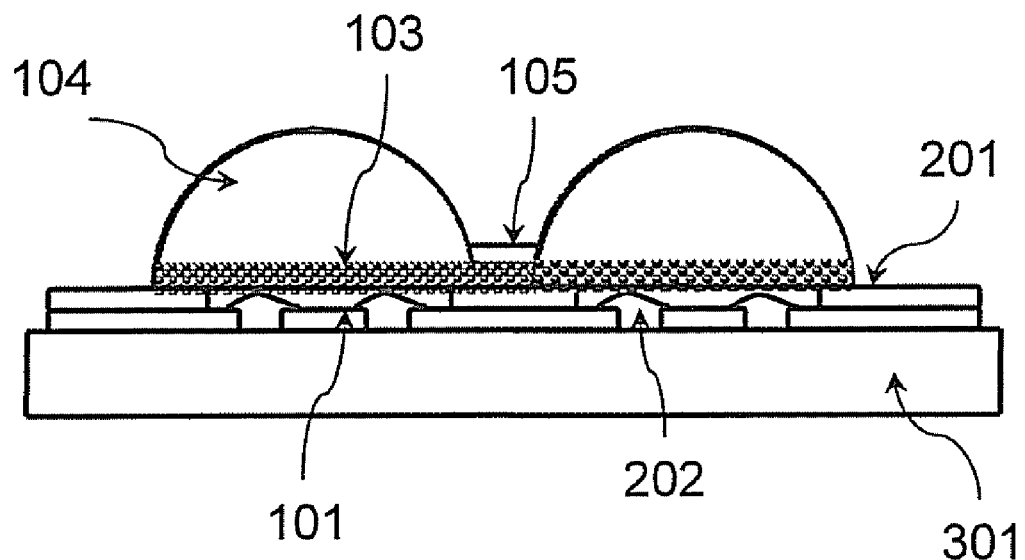
FIGS. 2A and 2B are simplified cross-sectional views of LED packages wherein LEDs are placed on a metal heat sink, and an array of phosphor encapsulation structures are mounted for light conversion.
Figure 2B:
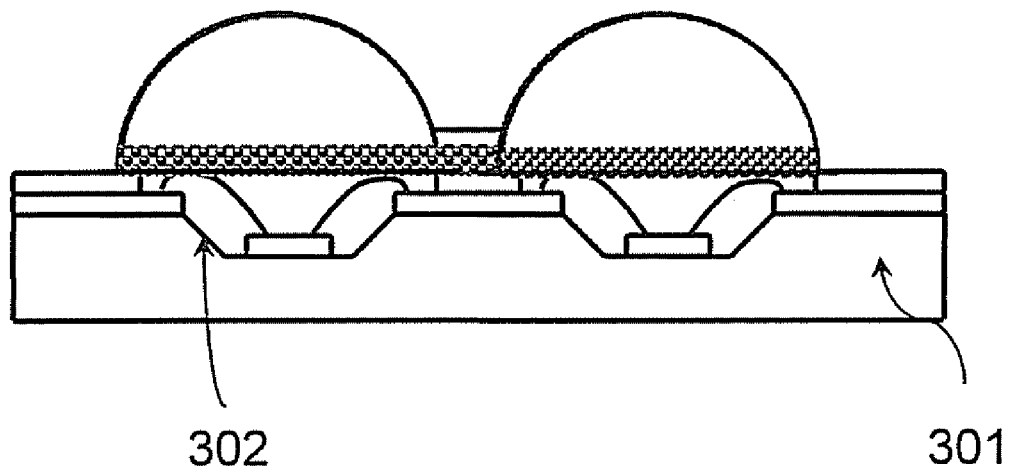

FIGS. 2A and 2B illustrates a light lamp or light engine structures as described in FIGS. 1A and 1B. In this embodiment, phosphor encapsulation structure 104 is an array structure which is aligned on LED chips placed on the heat sink. Each encapsulation is still connected with encapsulation material which may have or may not have phosphor particles in the connection 105. Keeping phosphor encapsulation structure 104 in an array form can simplify process steps during formation of phosphor encapsulation, as well as increase throughput of encapsulation placement in manufacturing.

As shown in FIG. 3, methods of forming phosphor encapsulation structure are described in our previous patent applications. The phosphor encapsulation structures mounted on heat sink may be in various shapes or in a sheet form depending on desired light quality such as color uniformity or light radiation pattern. Materials of phosphor encapsulation structure may be epoxy or silicone material, or thermoplastic or thermosetting material, or ceramic plate, or glass or any materials that can be used for LED encapsulation. Phosphor particles 103 may contain single or multi-layers of phosphors which may have different optical properties depending on desired optical properties.

Figure 4:
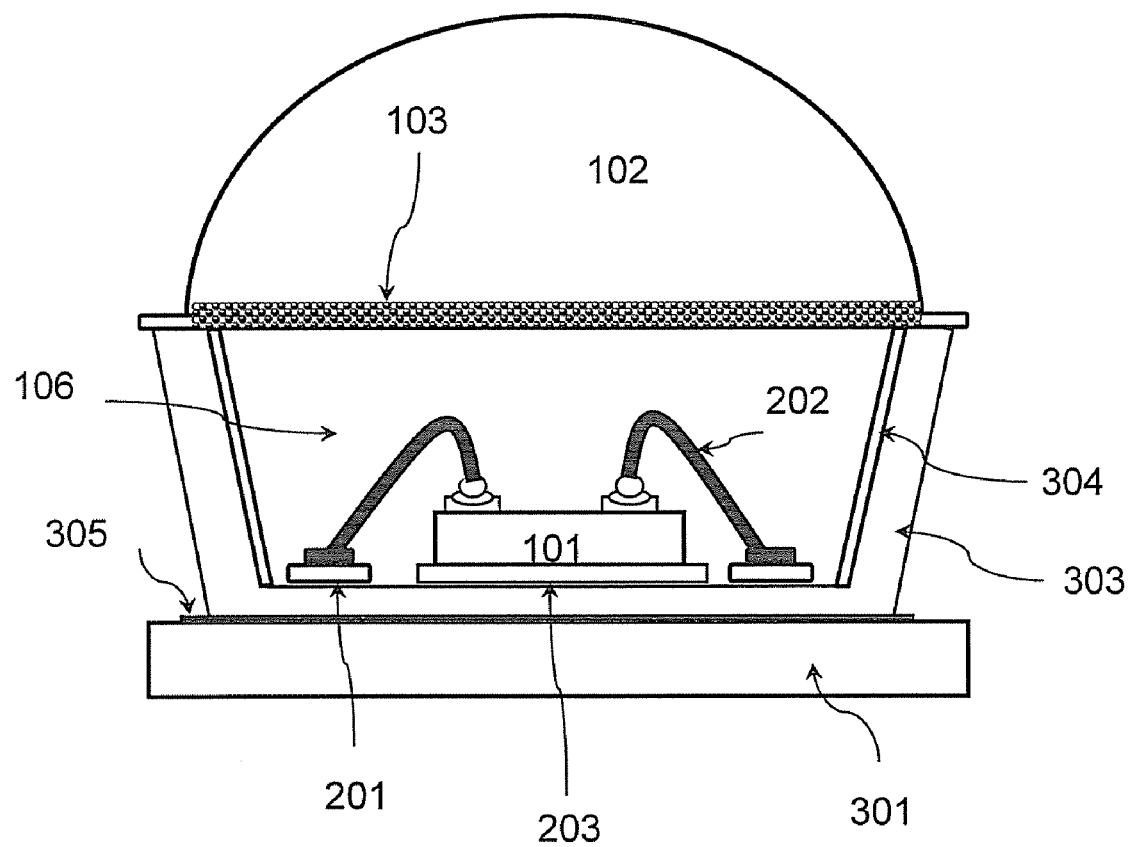
FIG. 4 is simplified cross-sectional views of LED package wherein LED is placed on a metal heat sink, and an integrated reflector with heat sink. The reflector may have highly reflective coating to increase light extraction through phosphor encapsulation structures.

FIG. 4 illustrates a method of packaging LED in one embodiment of the present invention. LED 101 is placed on a heat sink 301 with an epoxy or solders material 203. A reflector 303 is mounted on heat sink 301 with solder material 305. Alternatively the reflector 303 may be formed together with heat sink 301 to eliminate thermal barrier of solder material 305. The heat sink material may be copper, aluminum, ceramic, silicon, or other thermal conductive materials commonly used for LED package. The height of reflector may or may not be greater than the loop of bonded wire 202, ensuring that the wires 202 are not damaged during encapsulation placement. The surface of reflector 303 may be coated with a layer of highly reflective material 304, such as $TiO_x$ or whitish PCB material to increase light extraction. PCB material 201 is attached and may or may not be laminated on the surface of heat sink as an insulator for electrical connection. The phosphor encapsulation 102 as the above described may be in various shapes or a sheet as shown in FIG. 3. A predetermined amount of silicone gel is injected to fill up the space 106 after encapsulation placement. Alternatively, the space 106 may be filled with silicone material prior to phosphor encapsulation or lens attachment. Alternatively, the space 106 may also be the bottom part of over layered 103 which fills up 106 with silicone material prior to lens attachment. The packaging structure may contain one of more LEDs covered with single phosphor encapsulation.

For LED chips with two metal contacts (p and n contacts) located on the same side, LEDs may be connected in series or in parallel in the package as the-above illustrated. The electrical connection can be proper layout on laminated PCB 201 for connection in series or parallel depending on application.

Figure 5:
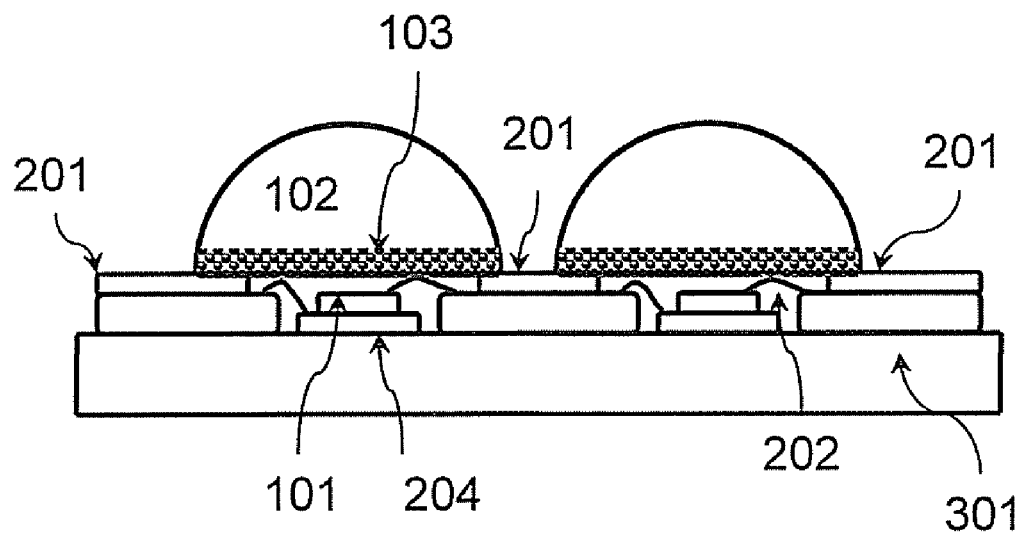
FIG. 5 is simplified cross-sectional views of LED package wherein LED is vertical type of chip, mounted on an insulating layer placed on metal heat sink, and a phosphor encapsulation structure is attached for light conversion.
Figure 5:
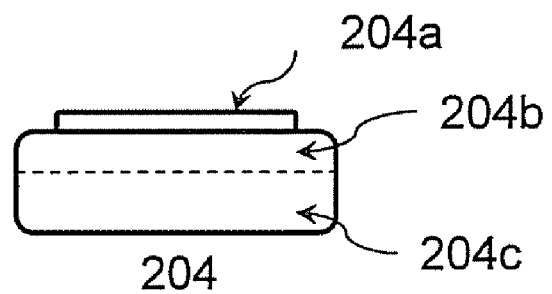

For LED chips with two metal contacts (p and n contacts) located on the opposite side so called vertical chip, LED mounted on metal heat sink which serves as common ground for LED chips, results in parallel connection. Therefore, an insulating layer 204 is required in between LED bottom contact, and the metal heat sink 301 for series connection of vertical chips, as illustrated in FIG. 5. The electrical connection can be proper layout on laminated PCB 201 for electrical connection. Other than insulating layer 204, all embodiments described in the above for LEDs with the metal contact on the same side in FIGS. 1 to 4 can be applied to the vertical chip as well.

The insulating layer 204 may include metal bond pads 204a on $AlO_x$ 204b/aluminum 204c, or $SiO_2$ 204b/silicone 204c, or ceramic, or PCB material or other insulating materials with good thermal conductivity. In some embodiments of the present invention, material 204b may be the same material as heat sink 301 such as Aluminum, copper, ceramic, silicon or other thermal conductive materials commonly used for LED package.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention.

What is claimed is:
1. A method for forming a light emitting device, the method comprising:
 providing a light emitting diode (LED) configured to emit light of a first color;
 providing a plurality of semi-spherical lenses made of a silicone material that contains no phosphor material, each of the lenses having a layer of phosphor material attached thereto;
 testing the plurality of lenses to select a subset of lenses that converts light of the first color to light of a second color; and
 forming the light emitting device using said LED, one of the selected subset of lenses, and a heat conductive substrate.

2. The method of claim 1, wherein the forming of the light emitting device comprises, after the testing of the plurality of lenses, disposing said one of the selected subset of lenses overlying said LED.

3. The method of claim 1, wherein the testing of the plurality of lenses is conducted with a light source other than said LED.

4. The method of claim 1, wherein each of the plurality of semi-spherical lenses comprises a semi-spherical surface and a flat surface.

5. The method of claim 4, wherein the layer of phosphor material is attached to the flat surface.

6. The method of claim 4, wherein the layer of phosphor material is attached to the semi-spherical surface.

7. The method of claim 1, wherein each of the plurality of lenses comprises a convex surface and a concave surface.

8. The method of claim 7, wherein the layer of light-conversion material is attached to the concave surface.

9. The method of claim 7, wherein the layer of light-conversion material is attached to the convex surface.

10. The device of claim 1, wherein the heat conductive substrate comprises an electrical circuit for wiring connection.

11. The device of claim 1, wherein the heat conductive substrate further comprises an integrated optical reflector being shaped with part of the heat conductive substrate.

12. The device of claim 1, further comprising a bond-wire loop that does not exceed the very top surface of a circuit board on the heat conductive substrate.

13. A method for forming a light emitting device, the method comprising:
 providing a light emitting diodes (LED) configured to emit light of a first color;
 providing a plurality of lenses, each of the lenses having a layer of light-conversion material attached thereto;
 testing the plurality of lenses to select a subset of lenses that converts light of the first color to light of a second color; and
 forming the light emitting device using the LED, one of the selected subset of lenses, and a heat conductive substrate.

14. The method of claim 13, wherein the forming of the light emitting device comprises, after the testing of the plurality of lenses, disposing said one of the selected subset of lenses overlying said LED.

15. The method of claim 13, wherein the testing of the plurality of lenses is conducted with a light source other than said LED.

16. The method of claim 13, wherein:
 each of the plurality of lenses comprises a semi-spherical surface and a flat surface; and
 the layer of light-conversion material is attached to the flat surface.

17. The method of claim 13, wherein:
 each of the plurality of lenses comprises a convex surface and a concave surface; and the layer of light-conversion material is attached to the concave surface.

18. The method of claim 13, wherein:
each of the plurality of lenses comprises a convex surface and a concave surface; and
the layer of light-conversion material is attached to the convex surface.

19. The method of claim 13, wherein each of the plurality of lenses is made of non-light-conversion material.

20. The method of claim 13, wherein each of the plurality of lenses is made of silicone and contains no light-conversion material.

21. The method of claim 13, wherein the heat conductive substrate comprises an electrical circuit for wiring connection.

22. The method of claim 13, wherein the heat conductive substrate further comprises an integrated optical reflector being shaped with part of the heat conductive substrate.

23. The method of claim 13, wherein a bond-wire loop does not exceed the very top surface of a circuit board on the heat conductive substrate.

* * * * *